(12) United States Patent
Heymann et al.

(10) Patent No.: US 12,315,588 B2
(45) Date of Patent: May 27, 2025

(54) METHOD AND APPARATUS FOR IMPROVED MEMORY MODULE SUPPLY CURRENT SURGE RESPONSE

(71) Applicant: Intel Corporation, Santa Clara, CA (US)

(72) Inventors: Douglas Heymann, Hillsboro, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 788 days.

(21) Appl. No.: 17/369,851

(22) Filed: Jul. 7, 2021

(65) Prior Publication Data

US 2021/0407553 A1    Dec. 30, 2021

(51) Int. Cl.
*G11C 5/14*     (2006.01)
*G05F 1/46*     (2006.01)

(52) U.S. Cl.
CPC .............. *G11C 5/147* (2013.01); *G05F 1/465* (2013.01)

(58) Field of Classification Search
CPC .............. G11C 5/14; G11C 5/04; G05F 1/465
See application file for complete search history.

(56) References Cited

U.S. PATENT DOCUMENTS

| 3,068,715 | A | * | 12/1962 | Brennan | F16H 61/0206 477/121 |
| 5,641,986 | A | * | 6/1997 | Uchida | G11C 5/145 326/88 |
| 7,099,794 | B2 | | 8/2006 | LeClerg et al. | |
| 7,277,011 | B2 | | 10/2007 | Estakhri | |
| 7,984,250 | B2 | | 7/2011 | Steinbrecher et al. | |
| 8,055,922 | B2 | | 11/2011 | Brittain et al. | |
| 9,576,615 | B1 | * | 2/2017 | Mahran | G06F 12/02 |
| 2008/0143417 | A1 | * | 6/2008 | Campbell | H03K 3/012 327/333 |
| 2012/0084575 | A1 | * | 4/2012 | Flores | G06F 13/14 713/300 |
| 2014/0132334 | A1 | * | 5/2014 | Park | G11C 5/14 327/513 |
| 2018/0166145 | A1 | * | 6/2018 | Cho | G11C 29/50016 |
| 2019/0279705 | A1 | * | 9/2019 | Prather | G06F 13/102 |
| 2019/0340141 | A1 | * | 11/2019 | Patel | G06F 3/0659 |
| 2019/0385645 | A1 | * | 12/2019 | Park | G11C 29/021 |
| 2021/0407553 | A1 | * | 12/2021 | Heymann | G11C 5/147 |
| 2022/0084604 | A1 | * | 3/2022 | Yamasaki | G11C 16/0483 |

* cited by examiner

*Primary Examiner* — Khamdan N. Alrobaie
(74) *Attorney, Agent, or Firm* — Compass IP Law PC

(57) ABSTRACT

An apparatus is described. The apparatus includes a power management integrated circuit (PMIC) to generate a supply voltage for a memory module. The PMIC is to perform a measurement during bring-up of the memory module of a worst case current draw of the memory module and/or corresponding droop in the supply voltage. The PMIC is to apply a step-up to the supply voltage in accordance with the measurement in response to detection by the PMIC of a surge in the memory module's current draw during operation of the memory module.

19 Claims, 7 Drawing Sheets

METHOD AND APPARATUS FOR IMPROVED MEMORY MODULE SUPPLY CURRENT SURGE RESPONSE

FIELD OF INVENTION

The field of invention pertains generally to the electronic arts, and, more specifically, to a method and apparatus for improved memory module supply current surge response.

BACKGROUND

With increasing densities of integrated logic functions in computing systems and other electronic systems, system designers are increasingly seeking ways to reduce power consumption in their respective systems.

FIGURES

DETAILED DESCRIPTION

Figure 1:
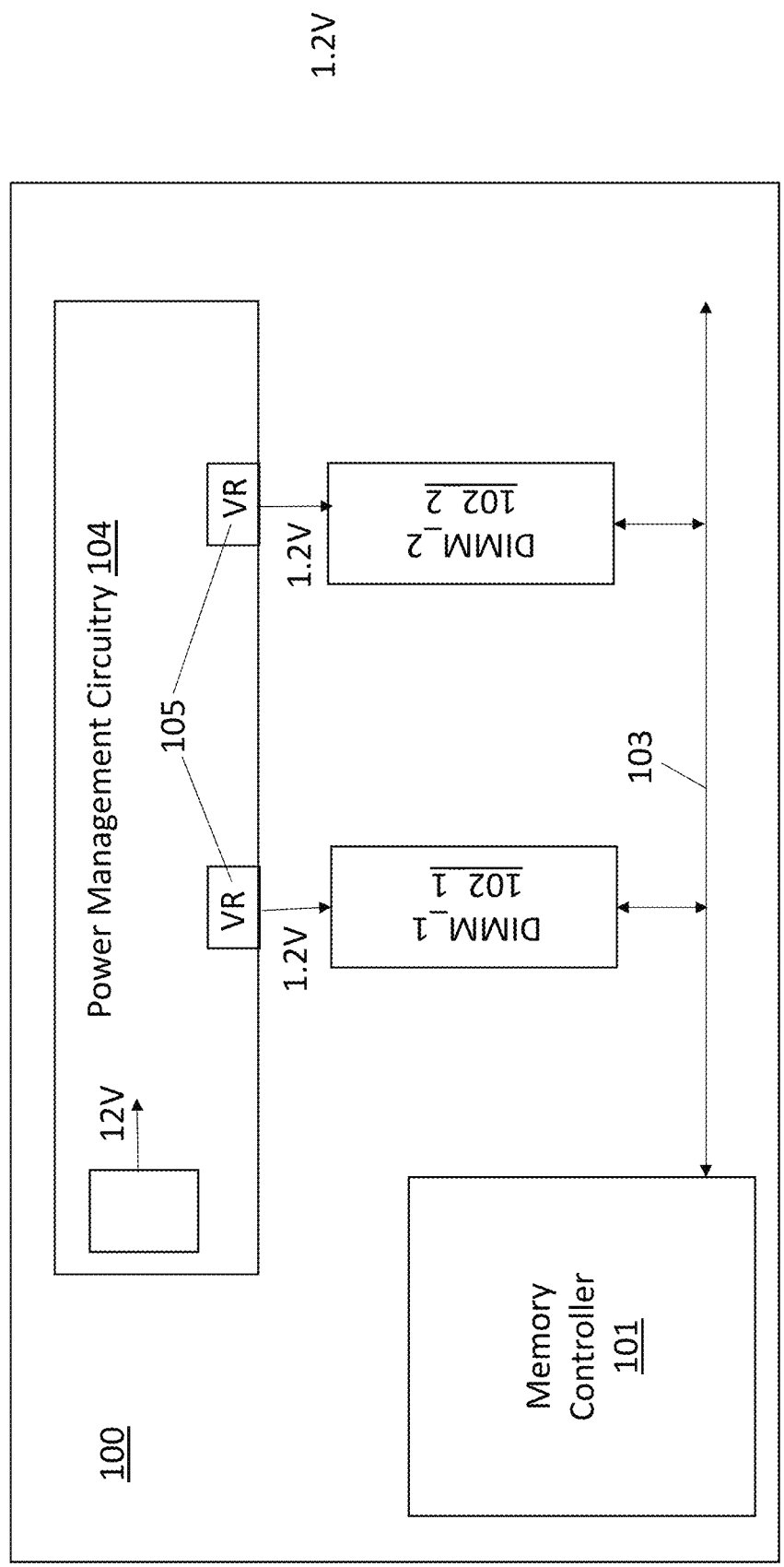
FIG. 1 depicts a memory system (prior art)

FIG. 1 shows a prior art memory system implementation. As observed in FIG. 1, a memory controller 101 is coupled to first and second dual in-line memory modules (DIMMs) 102_1, 102_2 through a memory channel 103. In an implementation that uses "load reduced" DIMMs (LRDIMMs), each DIMM includes multiple memory chips, buffer chips and a registering clock driver (RCD) chip (not depicted in FIG. 1 for illustrative convenience).

The DIMMs receive their supply voltage from power management circuitry 104 disposed on the motherboard 100 that the DIMMs 102 are plugged into. The power management circuitry 104 includes one or more voltage regulators 105 that provide supply voltages to the DIMMs' respective semiconductor chips. For Joint Electron Device Engineering Council (JEDEC) dual data rate 4 ("DDR4") implementations, for example, the voltage regulators 105 provide a supply voltage of 1.2V to the DIMMs 102.

As is known in the art, the voltage regulators 105, or circuitry that is coupled to the voltage regulators, performs step-down conversion to generate the 1.2V supply voltage (for ease of discussion the remainder of the description assumes the voltage regulators also perform step-down conversion).

Step-down conversion is a technique that produces a supply having lower voltage but higher current draw capacity from a higher voltage and lower current supply. For example, again in the case of a DDR4 implementation, the regulators 105 receive a 12V supply voltage having limited current source capacity. The regulators 105 then convert the 12V input supply to a 1.2 V output supply that is capable of providing more current than their 12V input supply is capable of providing.

An event that the regulators 105 and/or power management circuitry 104 as a whole is/are designed to handle includes a sudden and dramatic increase in current draw from the regulators' 1.2V output supply voltage node(s). For example, if for some reason the memory chips on the DIMMs 102 are suddenly reading/writing complex bit patters that translate into maximum current draw from each memory chip's input supply voltage pin, the voltage regulators 105 will observe a sudden surge in current draw from their 1.2V output supply node(s).

Figure 2:
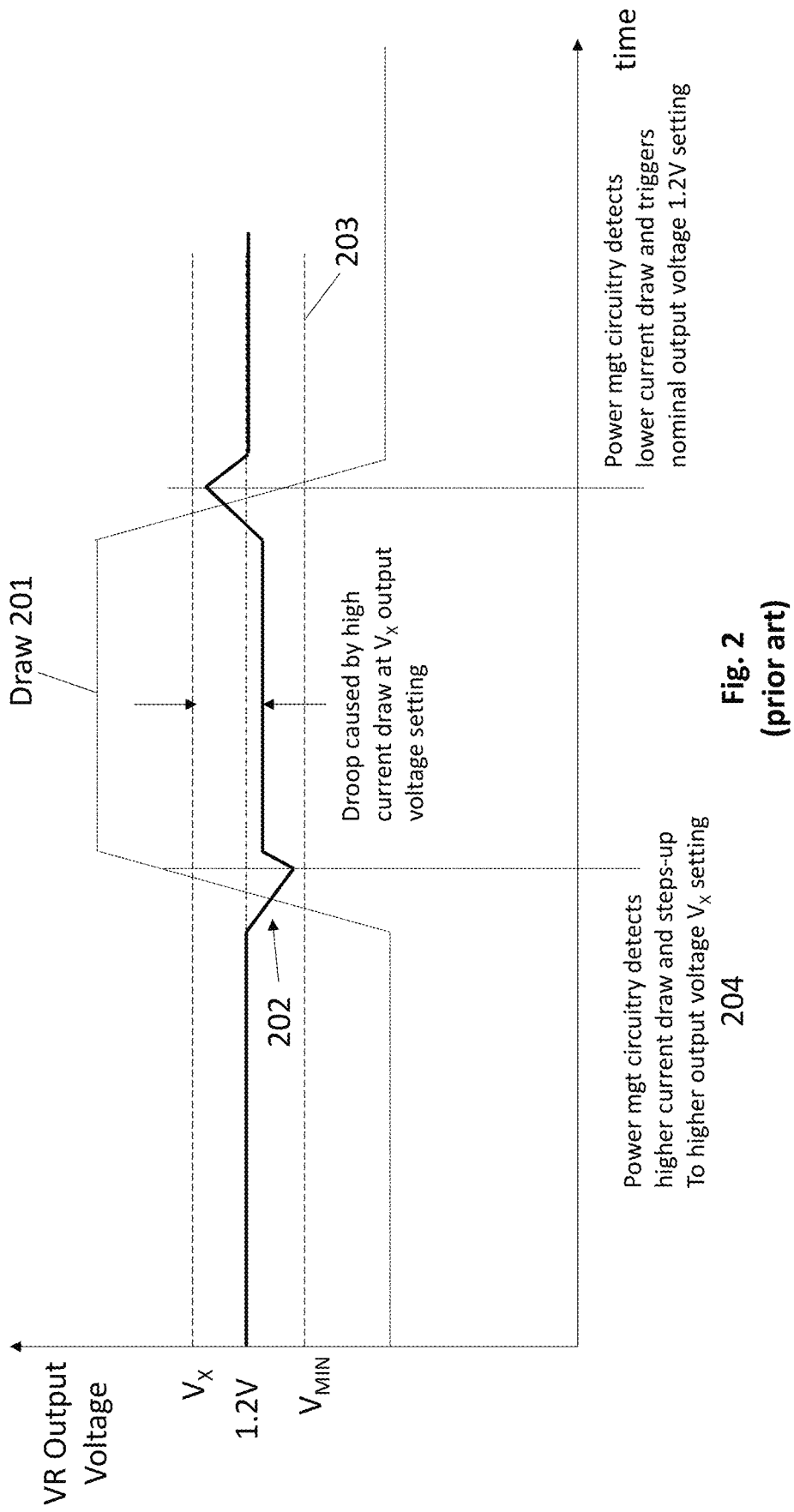
FIG. 2 depicts a power management circuit response to a surge in current draw (prior art)

As observed in FIG. 2, a sudden surge in drawn current 201 from the DIMMs can cause a down-converted output supply voltage to "droop" 202. That is, the sudden surge in current draw causes the circuitry that performs the down-conversion to momentarily produce an output voltage that is lower than its nominal value (=1.2V in FIG. 2). Without any safeguards, the supply voltage could droop beneath the minimum allowable supply voltage limit 203. For example, if the output voltage has a nominal value of 1.2V and the output voltage droops 0.25V in response to the sudden increase in current draw, the output voltage will fall to 0.95V. If the minimum allowed supply voltage is 1.0V, the supply voltage momentarily drops below its minimum 203 which, e.g., can cause data corruptions because the memory chips, etc. are operating outside of their rated supply voltage range.

As such, in order to prevent the output voltage from drooping beneath its minimum allowed value 203, the voltage regulators 105 and/or power management circuitry 104 is/are designed to detect the current surge and increment ("step-up") the output voltage in response 204. Here voltage regulators are programmable or can otherwise be configured to provide any of a number of different output supply voltages.

The power management circuitry 104 and/or voltage regulators 105 is/are therefore designed to change their output supply voltage configuration in response to a detected surge in current draw (from 1.2V to $V_x$ as observed in FIG. 2). For example, the output supply voltage configuration is automatically changed 204 from 1.2V to $V_x$=1.35V in response to a detected surge in current draw (i.e., the configured output supply voltage is stepped-up by 0.15V). Continuing with the above example, if the output voltage droops 0.25V in response to the current surge, the supply voltage will only fall to 1.1V during the maximum droop which remains above the minimum allowable value of 1.0V.

Notably, there is a wide spectrum of different types of DIMMs that can influence the worst case current draw observed by the voltage regulator(s) and/or power management circuitry. For example, there are load-reduced DIMMs (LRDIMMs) that include both an RCD chip and buffer chips, there are registered DIMMs (RDIMMs) that include the RCD chip but not the buffer chips and there are unbuffered DIMMs (UDIMMs) that do not include either the RCD chip or the buffer chips. Moreover, there can be different numbers of "ranks" of memory chips per DIMM (e.g., single rank, dual rank, quad rank) to effect different storage capacities (e.g., 64 GB DIMM vs. 128 GB DIMM) even if identical memory chips are used across DIMMs.

The wide range of different DIMMs can substantially affect the worst case current surge that is observed by the voltage regulators and/or power management circuitry. For example, if the DIMMs in FIG. 1 are single rank UDIMMs their combined worst case current surge could be only a fraction of the combined worst case current surge of quad rank LRDIMMs. Further still, DIMMs from different suppliers can exhibit different worst case surges even if the DIMMs are otherwise comparable (e.g., a 64 GB LRDIMM from supplier A can exhibit less worst case surge than a 64 GB LRDIMM from supplier B).

With such different worst case current surges across different DIMM types and DIMM suppliers, the worst case supply voltage droop is similarly affected (e.g., the droop for single rank UDIMMs from supplier A could be far less than for quad rank LRDIMMs from supplier B).

A problem, however, is that the configured step-up in supply voltage that is triggered in response to the current surge (0.15V in the above example) is fixed irrespective of the type of DIMMs that are plugged into the system or the supplier of the DIMMs that are plugged into the system.

That is, the output voltage step-up that is applied in response to a detected current surge 204 (e.g., 0.15V) is the same irrespective of whether there are single rank UDIMMs from supplier A or quad rank LRDIMMs from supplier B plugged into the system (or any other DIMMs in between). Further still, the fixed step-up assumes an absolute worst case scenario (e.g., quad rank LRDIMMs from supplier B) and corresponding worst case voltage droop.

In system configurations where the types and/or suppliers of the DIMMs that are plugged into the motherboard 100 are not capable of generating the absolute worst case surge, the fixed increment in step-up supply voltage is tantamount to overkill. That is, the output voltage will step-up far more than is necessary. For example, if the absolute worst case droop is 0.35V with absolute worst case DIMMs (e.g., quad rank LRDIMMs from supplier B), the actual droop could be far less with other than worst case DIMMs (e.g., single rank UDIMMs from supplier A).

In the later case, in response to a detected current surge, the supply voltage will be stepped-up to an unnecessarily high value resulting in DIMMs that consume more power than necessary to operate them. For instance, continuing with the above example, if the fixed step-up is 0.25V to accommodate an absolute worst case droop of 0.35V, while, the actual DIMMs being used only cause a worst case droop of 0.05V (because the DIMMs being used are not the type that cause a 0.35V droop), the supply voltage will rise to 1.4V (1.20V (nominal)−0.05V (droop)+0.25V (step-up) =1.4V).

If the condition that causes the current surge remains for an extended period of time, the DIMMs will operate at an unnecessarily high supply voltage of 1.4V which, in turn, corresponds to DIMMs that are consuming too much power compared to what they would otherwise consume if run at the lower nominal voltage (1.2V). That is, in this particular example, the DIMM's supply voltage is 16.7% too high ((0.2/1.2)=0.167). With DIMM power consumption increasingly being an area of focus regarding overall system power consumption, a more versatile approach is appropriate.

Figure 3:
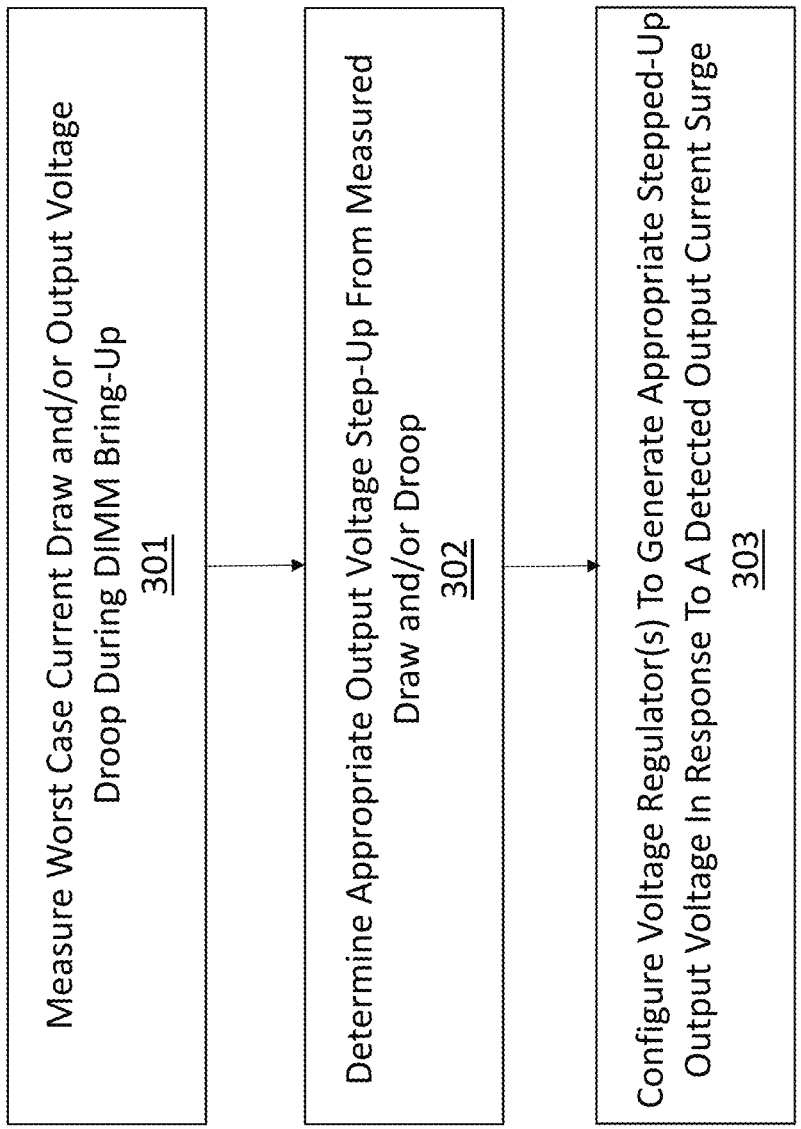
FIG. 3 shows an improved method for configuring a memory module.

FIG. 3 therefore pertains to an improved approach in which a DIMM is physically tested for its worst case current draw and/or resulting voltage droop during its initial installation 301. Once the DIMM's actual draw and/or resulting droop is known from the test results, an appropriate step-up voltage to be applied during subsequent detection of a current surge is determined 302. The voltage regulator(s) and/or power management circuitry are then programmed 303 to apply the specially determined step-up voltage in response to a subsequent detected surge in current draw. For ease of discussion, the following description assumes only a worst case current draw measurement is performed. However, it should be understood that supply voltage droop can also be measured alternatively to, or in combination with, a current measurement.

Ideally, the specially determined step-up voltage results in a supply voltage that remains above the minimum allowable value during a DIMM current surge but does not reach an unnecessarily high value (e.g., the supply voltages reaches a level that is closer to the nominal supply voltage than a value that is 16.7% higher than the nominal supply voltage). For example, during the surge, the output voltage stabilizes approximately at the nominal output voltage. In this case, the step-up is approximately equal to the droop.

In various embodiments the approach of FIG. 3 is performed during DIMM training. Here, as is known in the art, during the installation and configuration of a DIMM (DIMM "bring-up"), a DIMM is subjected to "training". During training, the memory controller determines appropriate signaling parameters to be used when communicating with the DIMM (e.g., on die termination reference voltage values are established). In various embodiments, DIMM training is expanded to include a test that causes a DIMM to draw a maximum amount of current (e.g., a worst case data pattern is written to and/or read from the DIMM) and perform the remaining processes of the improved methodology of FIG. 3.

According to a first approach, the technique of FIG. 3 is isolated for each DIMM on a DIMM by DIMM basis. In this case, each DIMM has its own dedicated power source (e.g., its own dedicated voltage regulator) whose output voltage is not affected by the current draw of other DIMMs.

In other approaches where multiple DIMMs are supplied power from a same voltage node, voltage regulator and/or power circuit such that the current draw of one DIMM can affect the supply voltage applied to another DIMM, the technique is applied to a group of DIMMs as a whole.

For example, if first and second slots in a same memory channel are fed by same power management circuitry and a first DIMM is already operating in one of the slots, and then a second DIMM is plugged into the other of the slots (e.g., to expand the memory capacity of the memory channel), the current draw test is applied to the combination of both DIMMs during installation of the second DIMM so that the combined worst case current draw from both DIMMs and resulting droop is understood. The step-up to be applied to the supply voltage in response to a worst case draw from both DIMMs is then specially configured in view of the test results.

In other embodiments, the DIMMs are enhanced to include their own power management circuits and voltage regulators. For example, referring to FIG. 4, which is consistent with a JEDEC DDR5 approach, each DIMM 402_1, 402_2 includes a respective power management integrated circuit (PMIC) 405.

Each PMIC 405 includes step-down conversion and voltage regulation circuitry to supply its respective DIMM's semiconductor chips with a supply voltage. In the DDR5 approach specifically, each PMIC 405 receives a 12V supply voltage. The PMIC then performs step-down conversion and voltage regulation to provide a regulated 1.0V output supply voltage. Importantly, each PMIC 405 includes logic 406 to perform the methodology of FIG. 3. The logic 406 can be implemented with dedicated circuitry (e.g., a state machine), executing program code (such as a micro-controller that executes firmware locally on the PMIC), or any combination thereof.

In an embodiment, during installation and configuration of a DIMM, the DIMM's PMIC 405 and the system that the DIMM is plugged into work together to perform the methodology of FIG. 3. For example, during the training of the DIMM, the memory controller 401 informs the PMIC 405 of details concerning the test that induces maximum current draw from the DIMM (e.g., the time the test is to take place, when current draw is to be measured, etc.). The PMIC 405, which includes current measurement circuitry to measure the current being drawn by the DIMM's semiconductor chips, then measures the DIMM's current draw at the appropriate time (e.g., when the memory controller 401 is applying worst case write/read activity to the DIMM).

After the PMIC 405 measures the worst case current draw, the PMIC 405 communicates the measured current to the memory controller 401 and/or larger host system. In an embodiment, the PMIC 405 includes register space where the current (and/or voltage droop) measurement is written to by the PMIC 405. The PMIC 405 then indicates to the memory controller 401 or host that the current measurement has been taken (or the appropriate amount of time elapses), at which point, the memory controller and/or host reads the current measurement information from the PMIC's register space. Alternatively, the PMIC 405 directly reports the results to the host.

Low level software, firmware or other program code of the host system (e.g., BIOS, Unified Extensible Firmware Interface (UEFI), etc.) has access to a listing in non-volatile memory or storage of the different DIMM types and DIMM suppliers that can plug into the system.

For each listed DIMM type (or listed DIMM type and DIMM supplier), an appropriate step-up is recorded for a particular current draw that is measured by the PMIC. The memory controller 401 and/or larger host system performs a look-up into the list information to determine the appropriate step-up for the particular DIMM type (or DIMM type and DIMM supplier) and its just measured current draw. The appropriate step-up is then communicated to the PMIC 405 which configures itself to apply the step-up if/when a current surge occurs.

In another embodiment the PMIC 405 is less dependent on the memory controller 401 and/or host. For example, the PMIC 405 arranges with (or is informed by) the memory controller 401 and/or host as to when the worst case current draw test is to take place. During the test, the PMIC 405 detects the DIMM's maximum current draw, determines the appropriate step-up voltage in view of the measured current and the DIMM type (and possibly DIMM supplier) and programs itself to apply the appropriate step-up voltage. Here, the PMIC includes the list information internally (e.g., with a read-only memory (ROM) circuit that is integrated in the PMIC) or the PMIC's DIMM includes such information) so that it can internally perform the look-up operation.

In still other embodiments, the appropriate step-up is determined from execution of a mathematical relationship by a processor or controller on the host, memory controller 401 or PMIC 405. Here, for example, the mathematical relationship accepts the measured current and DIMM type (or DIMM type and DIMM supplier) as input parameters and provides the appropriate step-up as an output (the mathematical relationship could also accept other input information such as the identity of the supplier of the DIMM, the types of semiconductor chips that are on the DIMM, etc.).

In still other embodiments the current measurement 301 is not even performed. Rather, the look-up is performed based solely on DIMM type, or DIMM type and supplier, without any reference to a measured worst case current draw.

Note that a memory controller 401 can be enhanced to include supporting logic 407 for performing the methodology of FIG. 3. For example, the supporting logic 407 can be designed to arrange with a PMIC when a worst case current draw test is to be performed, what read and/or write patterns are to be applied, etc. Again, logic 407 can be implemented with dedicated circuitry (e.g., a state machine), executing program code (such as a micro-controller that executes firmware locally on the memory controller), or any combination thereof. Logic 407 could also receive the current measurement information from the PMIC 405, perform the look-up into the listed information (or execute a mathematical relationship) and provide the appropriate step-up back to the PMIC 405.

Although embodiments above have been directed to a DIMM having a PMIC that performs various functions related to the approach of FIG. 3, in still other embodiments some or all of the methodology of FIG. 3 is performed by power management circuitry that is located off-DIMM such as power management circuitry that is integrated on the motherboard or other printed circuit board (PCB) that the DIMMs plug into.

Although embodiments above have focused DIMMs as the applicable memory module, other memory modules (e.g., stacked chip memory modules (e.g., High Bandwidth Memory (HBM) memory modules) can incorporate the teachings provided above.

Figure 5:
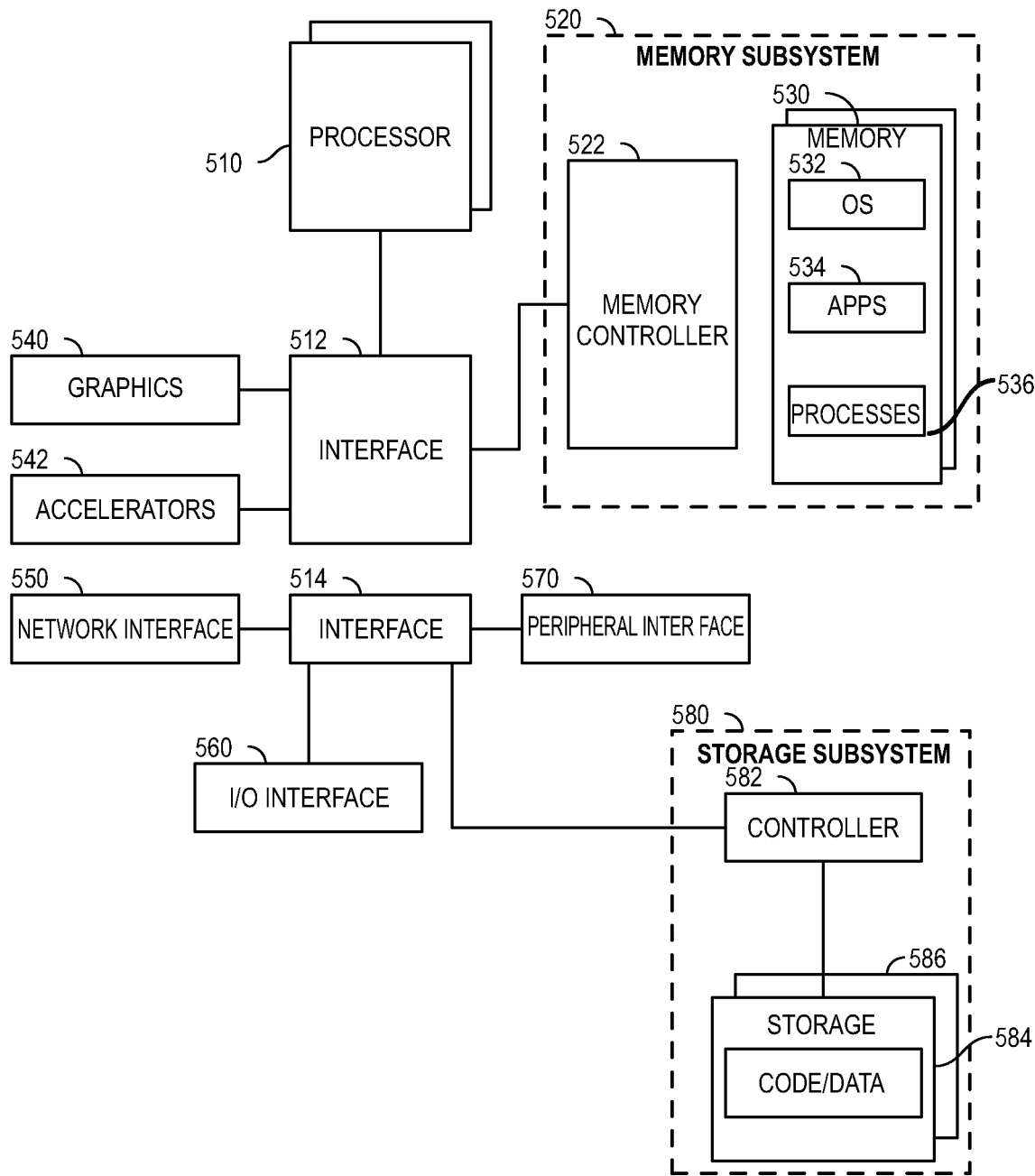
FIG. 5 shows a computing system.

FIG. 5 depicts an example system. The system can use the teachings provided herein. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU). For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software logic to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

Figure 4:
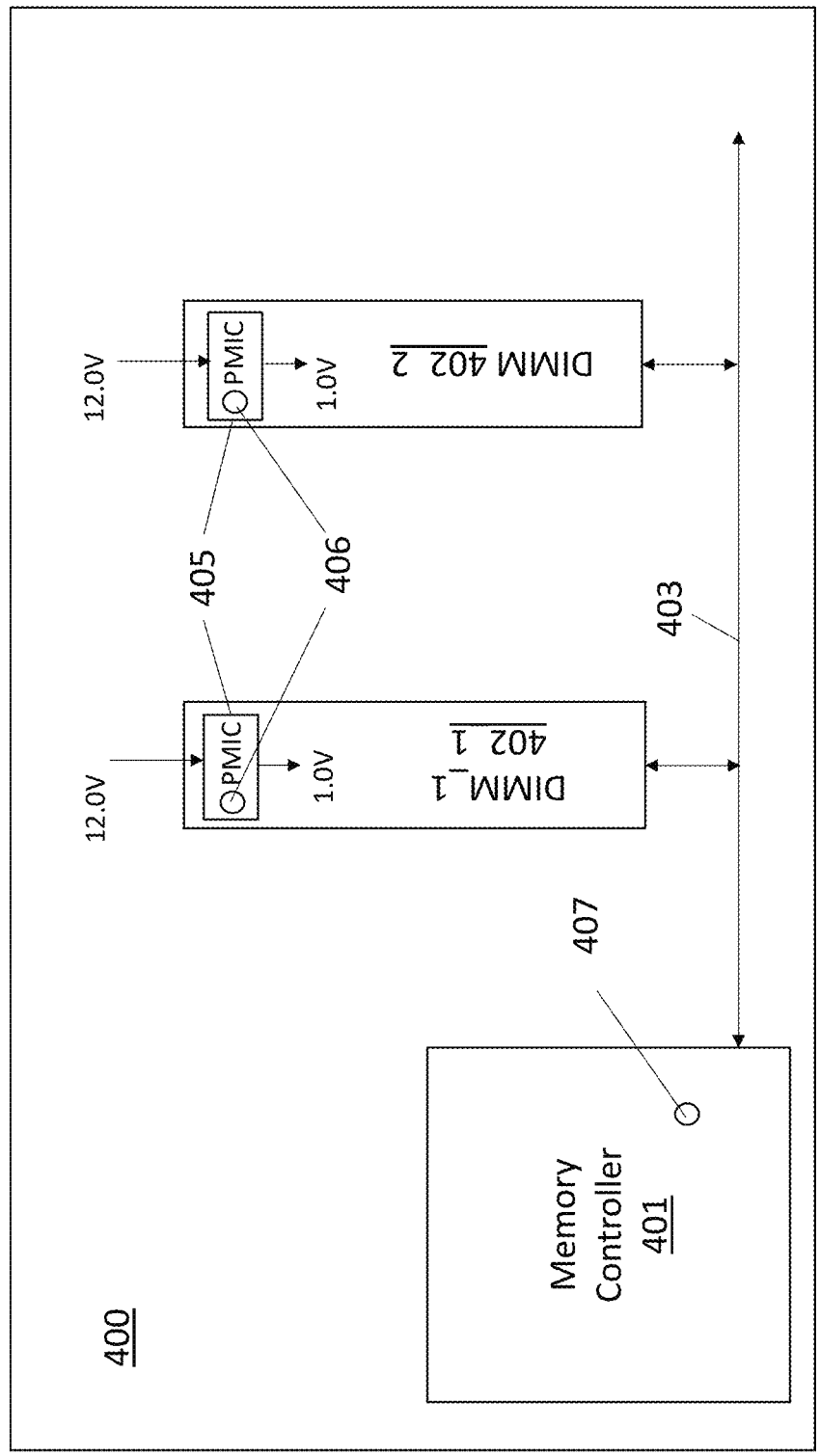
FIG. 4 shows an improved memory system.

The memory can be integrated on a memory module and make use of the teachings provided above with respect to FIGS. 3 and 4. Any such memory module can include non volatile memory (NVM) as described below as well as volatile memory as described just above.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits or logic in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 6:
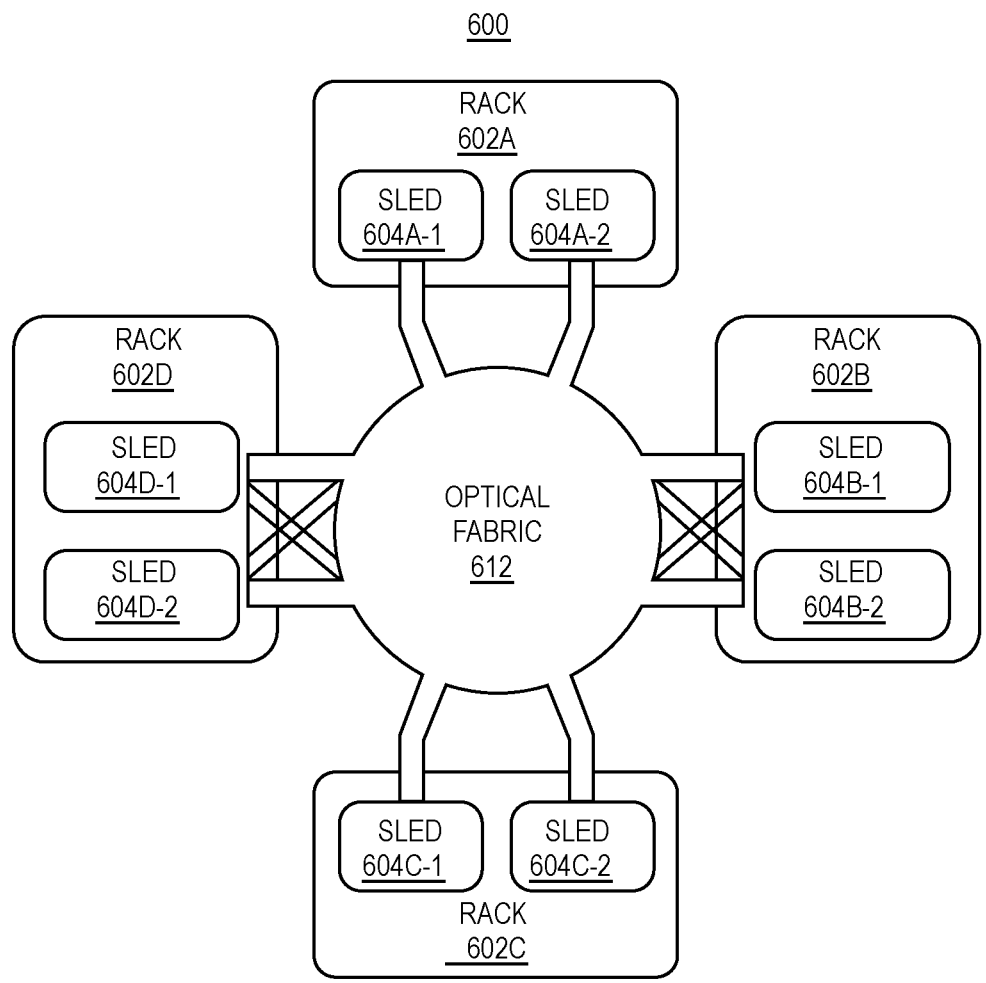
FIG. 6 shows a data center.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks. Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

Figure 7:
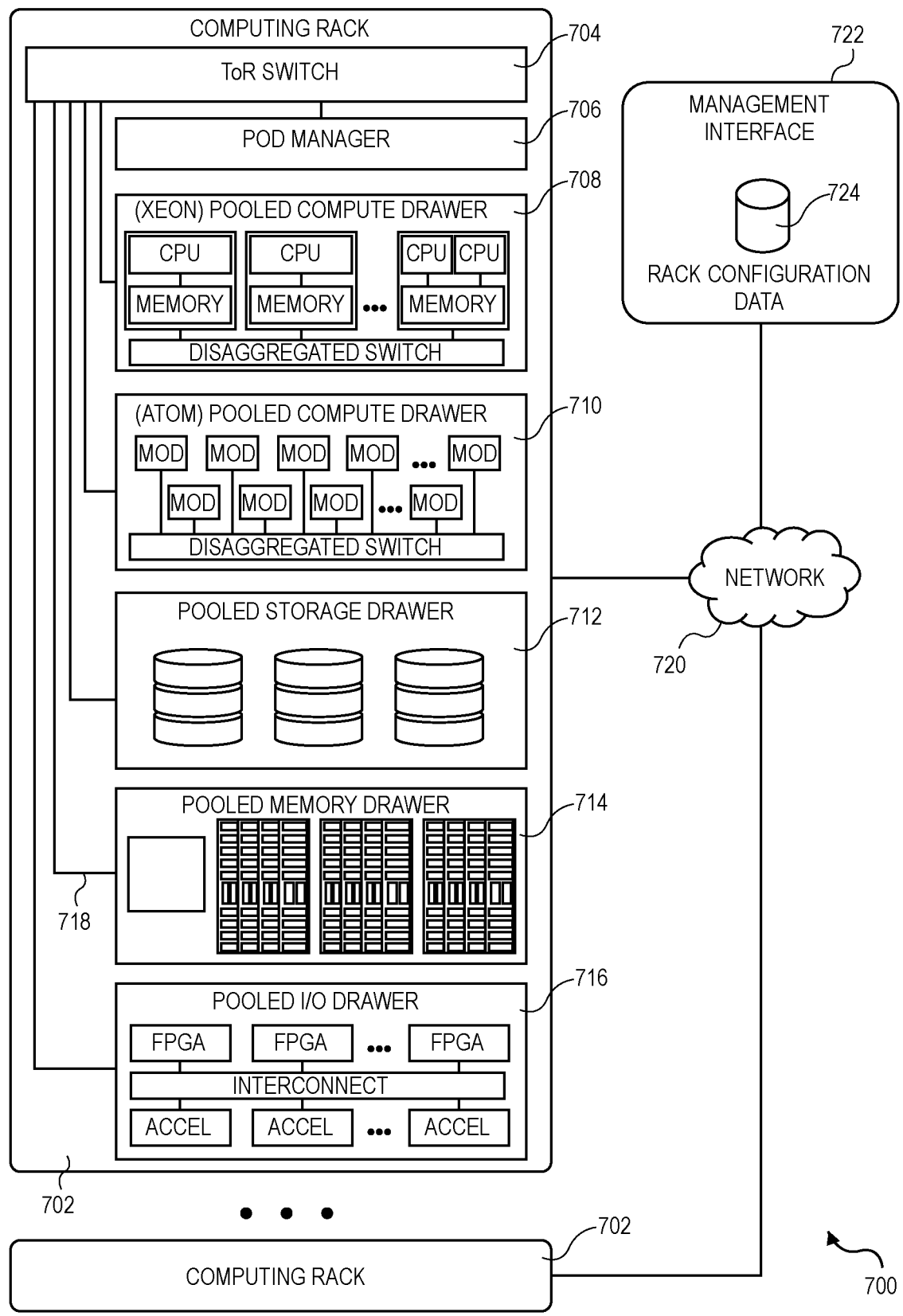
FIG. 7 shows a rack.

FIG. 7 depicts an environment 700 includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as a 40 Gigabit/second (Gb/s) or 100 Gb/s Ethernet link or an 100+ Gb/s Silicon Photonics (SiPh) optical link. In one embodiment high-speed link 718 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations.

RSD environment 700 further includes a management interface 722 that is used to manage various aspects of the RSD environment. This includes managing rack configuration, with corresponding parameters stored as rack configuration data 724.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a power management integrated circuit (PMIC) to generate a supply voltage for a memory module, the PMIC to perform a measurement during bring-up of the memory module of a worst case current draw of the memory module and/or corresponding droop in the supply voltage, the PMIC to apply a step-up to the supply voltage in accordance with the measurement in response to detection by the PMIC of a surge in the memory module's current draw during operation of the memory module.

2. The apparatus of claim 1 wherein the step-up negates the droop.

3. The apparatus of claim 1 wherein the step-up causes the supply voltage to remain closer to a nominal value during the surge than a value that is 16.7% higher than the nominal value.

4. The apparatus of claim 1 wherein the memory module is a dual in-line memory module.

5. The apparatus of claim 1 wherein the step-up is determined in view of a type of the memory module.

6. The apparatus of claim 5 wherein the step-up is determined in view of a supplier of the memory module.

7. The apparatus of claim 1 wherein the PMIC includes register space into which the measurement is to be recorded by the PMIC.

8. An apparatus, comprising:
a memory controller to communicate with a PMIC that is integrated on a memory module that the memory controller is to be coupled to, the memory controller to:
perform a look-up into information that lists step-up voltages for memory modules based at least on memory module type, the look-up to determine a step-up voltage for the memory module;
send to the PMIC the step-up voltage that the PMIC is to apply to a supply voltage provided to the memory module by the PMIC in response to detection by the PMIC of a surge of supply current drawn by the memory module during operation of the memory module.

9. The apparatus of claim 8 wherein the memory controller is to be coupled to the memory module by way of a memory channel that is compliant with a Joint Electron Device Engineering Council (JEDEC) specification.

10. The apparatus of claim 9 wherein the JEDEDC specification is a DDR5 JEDEC specification.

11. The memory controller of claim 8 wherein the memory controller is to receive a measurement performed by the PMIC of the memory module's worst case current draw and/or corresponding droop in the supply voltage.

12. The apparatus of claim 8 wherein the step-up causes the supply voltage to remain closer to a nominal value during the surge than a value that is 16.7% higher than the nominal value.

13. The apparatus of claim 8 wherein the memory module is a dual in-line memory module.

14. The apparatus of claim 8 wherein the step-up voltage is also determined in view of a supplier of the memory module.

15. A computing system, comprising:
a processor;
a network interface;
a memory including a memory module having a PMIC, the PMIC to provide a supply voltage to the memory module;
a memory controller coupled between the memory and the processor; and,
a storage medium containing program code that when processed by the processor causes the processor to perform a method, comprising:
performing a look-up into information that lists step-up voltages for memory modules based at least on memory module type, the look-up determining a step-up voltage for the memory module;
causing the step-up voltage to be communicated to the PMIC so that the PMIC will apply the step-up to the supply voltage in response to detection by the PMIC of a current surge by the memory module during operation of the memory module.

16. The computing system of claim 15 wherein the information further lists the step-up voltages based on a worst case current draw of the memory module and/or corresponding droop in the supply voltage, the PMIC to perform a measurement to determine the worst case current draw and/or corresponding droop in the supply voltage, the look-up to be performed with a result of the measurement that is provided by the PMIC.

17. The computing system of claim 15 wherein the information further lists the step-up voltages based on memory module supplier.

18. The computing system of claim 15 wherein the memory module is a DIMM.

19. The computing system of claim 15 wherein the step-up voltage causes the supply voltage to remain closer to a nominal value during the current surge than a value that is 16.7% higher than the nominal value.

* * * * *